US010340275B2

(12) United States Patent
Karpov et al.

(10) Patent No.: US 10,340,275 B2
(45) Date of Patent: Jul. 2, 2019

(54) STACKABLE THIN FILM MEMORY (71) Applicant: Intel Corporation, Santa Clara, CA (US)

(72) Inventors: Elijah V. Karpov, Portland, OR (US); Jack T. Kavalieros, Portland, OR (US); Robert S. Chau, Beaverton, OR (US); Niloy Mukherjee, Portland, OR (US); Rafael Rios, Austin, TX (US); Prashant Majhi, San Jose, CA (US); Van H. Le, Portland, OR (US); Ravi Pillarisetty, Portland, OR (US); Uday Shah, Portland, OR (US); Gilbert Dewey, Hillsboro, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/574,092

(22) PCT Filed: Jun. 23, 2015

(86) PCT No.: PCT/US2015/037237
§ 371 (c)(1),
(2) Date: Nov. 14, 2017

(87) PCT Pub. No.: WO2016/209218
PCT Pub. Date: Dec. 29, 2016

(65) Prior Publication Data
US 2018/0204842 A1 Jul. 19, 2018

(51) Int. Cl.
H01L 27/12 (2006.01)
H01L 27/108 (2006.01)
(Continued)

(52) U.S. Cl.
CPC ........ *H01L 27/108* (2013.01); *G11C 13/0007* (2013.01); *H01L 27/1156* (2013.01); *H01L 27/11551* (2013.01); *H01L 27/2436* (2013.01); *H01L 27/2472* (2013.01); *H01L 27/2481* (2013.01); *H01L 29/7869* (2013.01);
(Continued)

(58) Field of Classification Search
None
See application file for complete search history.

(56) References Cited

U.S. PATENT DOCUMENTS 6,838,721 B2 * 1/2005 Garni ............... H01L 23/522
257/296
9,431,603 B1 * 8/2016 Hsieh ............... H01L 45/085
(Continued)

OTHER PUBLICATIONS

International Preliminary Report on Patentability for International Patent Application No. PCT/US2015/037237, dated Dec. 26, 2017, 8 pages.
(Continued)

Primary Examiner — Dung A. Le
(74) Attorney, Agent, or Firm — Schwabe, Williamson & Wyatt, P.C.

(57) ABSTRACT

A thin film transistor is deposited over a portion of a metal layer over a substrate. A memory element is coupled to the thin film transistor to provide a first memory cell. A second memory cell is over the first memory. A logic block is coupled to at least the first memory cell.

20 Claims, 7 Drawing Sheets (51) Int. Cl.
  *H01L 27/24* (2006.01)
  *G11C 13/00* (2006.01)
  *H01L 27/11551* (2017.01)
  *H01L 27/1156* (2017.01)
  *H01L 29/786* (2006.01)
  *H01L 45/00* (2006.01)
(52) U.S. Cl.
  CPC ........ *H01L 45/145* (2013.01); *H01L 45/1625* (2013.01); *H01L 45/1633* (2013.01); *H01L 45/04* (2013.01); *H01L 45/06* (2013.01); *H01L 45/1233* (2013.01); *H01L 45/146* (2013.01); *H01L 45/148* (2013.01)

(56) References Cited

U.S. PATENT DOCUMENTS

| | | |
|---|---|---|
| 2005/0139882 A1 | 6/2005 | Xianyu et al. |
| 2005/0276115 A1* | 12/2005 | Yamaguchi ............ B82Y 10/00 365/185.22 |
| 2006/0163614 A1 | 7/2006 | Prall |
| 2006/0273298 A1 | 12/2006 | Petti |
| 2007/0007579 A1 | 1/2007 | Scheuerlein |
| 2011/0140069 A1 | 6/2011 | Inoue |
| 2012/0012944 A1 | 1/2012 | Yi |
| 2012/0112257 A1 | 5/2012 | Kato |
| 2014/0027702 A1 | 1/2014 | Lu |
| 2014/0138778 A1 | 5/2014 | Kato |
| 2014/0353662 A1 | 12/2014 | Shukh |
| 2016/0233333 A1* | 8/2016 | Toh .......................... H01L 43/12 |
| 2018/0122825 A1* | 5/2018 | Lupino ................... G11C 11/16 |

OTHER PUBLICATIONS

International Search Report and Written Opinion for International Patent Application No. PCT/US2015/037237 dated Mar. 31, 2016, 12 pgs.

Search Report for European Patent Application No. EP 15896511.1, dated Mar. 28, 2019, 9 pgs.

* cited by examiner

STACKABLE THIN FILM MEMORY

CROSS-REFERENCE TO RELATED APPLICATION

This patent application is a U.S. National Phase Application under 35 U.S.C. § 371 of International Application No. PCT/US2015/037237, filed Jun. 23, 2015, entitled "A STACKABLE THIN FILM MEMORY," which designates the United States of America, the entire disclosure of which is hereby incorporated by reference in its entirety and for all purposes.

FIELD

Embodiments as described herein relate to a field of electronic device manufacturing, and in particular, to memory manufacturing.

BACKGROUND

An embedded memory typically refers to an integrated on-chip memory that supports a logic core. Embedding a memory on a processor increases a bus width and an operation speed. High-performance embedded memory is a key component in a data processing system because of high-speed and wide bus-width capability, which eliminates inter-chip communication.

Generally, a memory array has a plurality of bitcells. A bitcell refers to a part of an integrated circuit in which a single bit is stored. A typical 1T-1R bitcell consists of a transistor connected to a memory element. The transistor provides an access to the memory element that stores a bit. Typically, the transistor is connected to the memory element to change a state of the memory element from one value to another value to store a bit. A conventional embedded memory technology is a silicon-based technology which is not stackable and therefore low density.

Figure 1:
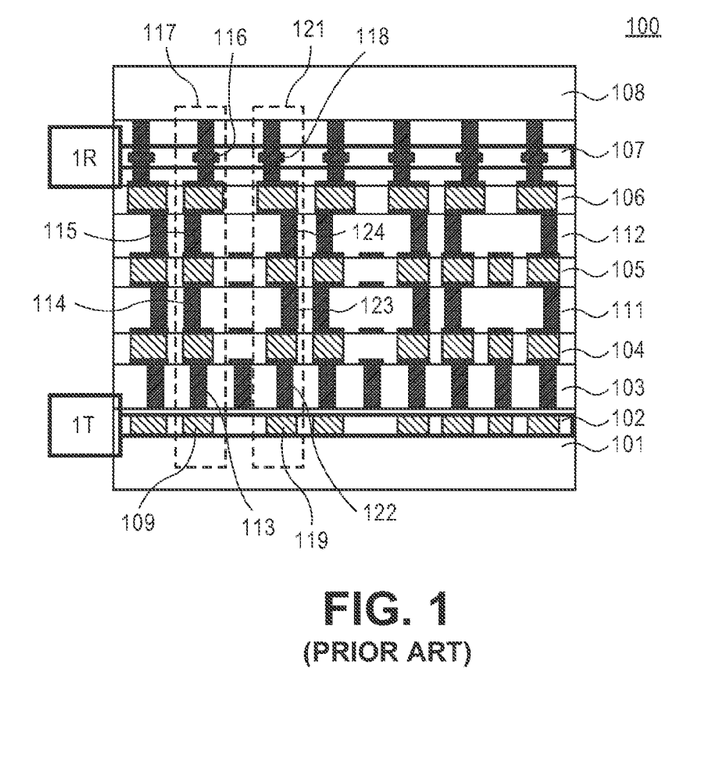
FIG. 1 illustrates a side view of a conventional 1T-1R memory array.

FIG. 1 illustrates a side view of a conventional 1T-1R memory array 100. A transistor array 102 is deposited on a silicon wafer 101. Transistor array 102 consists of a plurality of transistors, such as a transistor 109 and a transistor 119 formed directly on silicon wafer 101. Metal layers 104, 105, and 106 separated by dielectric layers 103, 111, and 112 are formed above the transistor array 102. The metal layers 104, 105, 106, and 108 are connected through vias, such as vias 113, 114, and 115, as shown in FIG. 1. A memory element array 107 is on metal layer 106. Memory element array 107 consists of memory elements, such as a resistor memory element 116 and a resistor memory element 118. A metal layer 108 is formed on memory element array 107, as shown in FIG. 1.

Conventional 1T-1R memory array 100 consists of a plurality of bitcells, such as a bitcell 117 and a bitcell 121. Each transistor of the transistor array 102 is connected to a corresponding one memory element of the memory element array 107 to form bitcells. Bitcell 117 consists of transistor 109 connected to resistor memory element 116 by vias 113, 114, and 115. Bitcell 121 consists of transistor 119 connected to resistor memory element 118 by vias 122, 123, and 124. As shown in FIG. 1, the bitcells of the conventional memory array are formed side-by-side. The bitcells of the conventional memory array are not stackable. The density of the bitcells in the conventional memory array is limited by the size of the silicon wafer.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Methods and apparatuses to provide a stackable thin film-based memory are described. In one embodiment, a memory comprises a thin film based transistor over a metal layer over a substrate. A resistor is coupled to the thin film transistor. The stackable memory architecture described herein increases density of the memory cells per a unit area of the integrated circuit. In at least some embodiments, the stackable memory architecture uses flexible substrates.

Embodiments described herein advantageously use a thin film based transistor in a bitcell to provide a stackable memory. The thin film based transistor in the bitcell advantageously enables the use of the flexible substrate, increases the memory array efficiency, and increases the memory cell density due to stacking capability.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Figure 2:
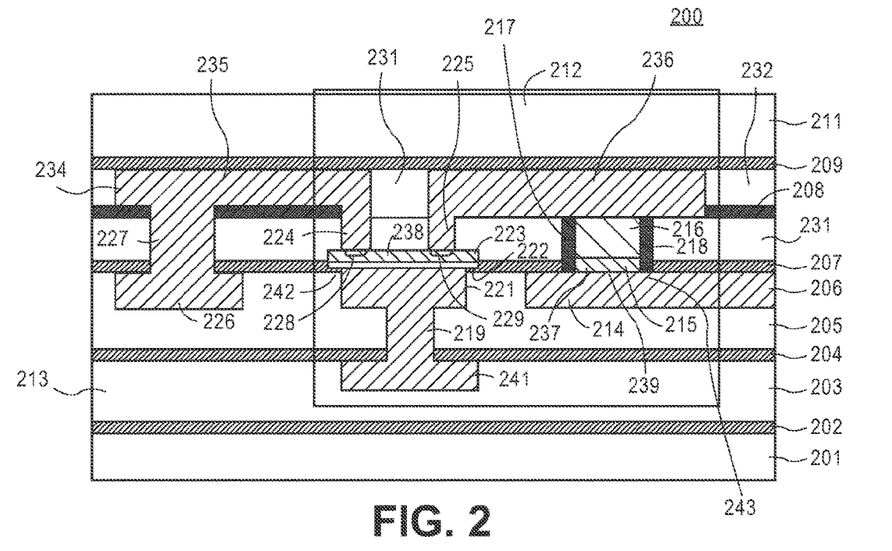
FIG. 2 shows a side view of a stackable memory cell according to one embodiment.

FIG. 2 shows a side view 200 of a stackable memory cell according to one embodiment. As shown in FIG. 2, a metal layer 213 comprises a metal interconnect 241 formed on an insulating layer 203 on an etch stop layer 202 on a substrate 201. In one embodiment, metal interconnect 241 is a wordline. In various embodiments, metal layer 213 comprises one or more conductive features, e.g., pads, conductive lines, trenches, interconnects, vias, other conductive features, and dielectric features.

In an embodiment, substrate 201 is a flexible substrate. In various embodiments, substrate 201 is a polymer based substrate, glass, or any other bendable substrate including 2D materials e.g., graphene and MoS2, organic materials e.g., pentacene, transparent oxides e.g., indium gallium zinc oxide (IGZO), polycrystalline III-V materials, polycrystalline Ge, polycrystalline Si, amorphous III-V materials, amorphous Ge, amorphous Si, or any combination thereof Typically, the amorphous III-V materials have a deposition temperature lower than that of the polycrystalline 1II-V materials. In one embodiment, substrate 201, e.g., a silicon wafer includes a memory array periphery devices, e.g., input/output devices. Placing the memory array periphery devices under the memory array advantageously increases the memory array efficiency while reducing the memory array area consumption.

In various implementations, substrate 201 can be, e.g., an organic, a ceramic, a glass, or a semiconductor substrate. In one embodiment, substrate 201 comprises a semiconductor material, e.g., silicon (Si). In one embodiment, substrate 201 is a monocrystalline Si substrate. In another embodiment, substrate is a polycrystalline silicon substrate. In yet another embodiment, substrate 201 is an amorphous silicon substrate. In alternative embodiments, substrate 201 includes silicon, germanium ("Ge"), silicon germanium ("SiGe"), a III-V materials based material e.g., gallium arsenide ("GaAs"), or any combination thereof. In one embodiment, the substrate 201 includes metallization interconnect layers for integrated circuits. In at least some embodiments, the substrate 201 includes electronic devices, e.g., transistors, memories, capacitors, resistors, optoelectronic devices, switches, any other active and passive electronic devices that are separated by electrically insulating layers, for example, interlayer dielectric layers, trench insulation layers, or any other insulating layers known to one of ordinary skill in the art of the electronic device manufacturing. In at least some embodiments, the substrate 201 includes metal interconnects and vias configured to connect the metallization layers. In an embodiment, substrate 201 is a semiconductor-on-isolator (SOI) substrate including a bulk lower substrate, a middle insulation layer, and a top monocrystalline layer. The top monocrystalline layer may comprise any material listed above, e.g., silicon.

In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the embodiments of the present invention.

In one embodiment, the thickness of the substrate 201 is from about 0.5 microns (μm) to about 1000 μm. In more specific embodiment, the thickness of the substrate 201 is about 700 μm.

In one embodiment, etch stop layer 202 comprises one or more insulating layers. In one embodiment, etch stop layer 202 comprises one or more nitride layers, e.g., a silicon nitride, a silicon oxide nitride, other nitride layer, or any combination thereof. In another embodiment, etch stop layer 202 comprises one or more oxide layers, e.g., a silicon oxide layer, an aluminum oxide, a carbon doped silicon oxide, other etch stop layer, or any combination thereof. In one embodiment, the thickness of etch stop layer 202 is from about 2 nm to about 20 nm.

In an embodiment, etch stop layer 202 is deposited using one or more etch stop layer deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In one embodiment, insulating layer 203 comprises one or more electrically insulating layers. In one embodiment, insulating layer 203 is an interlayer dielectric (ILD) layer. In one embodiment, insulating layer comprises one or more oxide layers, e.g., a silicon oxide layer, a doped porous silicon oxide, an aluminum oxide, a carbon doped silicon oxide, other electrically insulating layer. In alternate embodiments, insulating layer 203 comprises organic materials, inorganic materials, or both. In one embodiment, the thickness of the insulating layer 203 is determined by an integrated circuit design. In one embodiment, insulating layer 203 is deposited to the thickness from about 50 nanometers (nm) to about 200 nm.

In an embodiment, insulating layer 203 is deposited using one or more insulating layer deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Generally, the material of the underlying etch stop layer, e.g., etch stop layer 202 has etch characteristics that are different from the etch characteristics of the material of the insulating layer to be etched, e.g., insulating layer 203. In an embodiment, the etch stop layer is placed underneath the etched insulating layer to stop an etching process. Generally, the etching rate of the etched insulating layer, e.g., insulating layer 203 is substantially higher than the etching rate of the etch stop layer, such as etch stop layer 203 at identical etching conditions. In one embodiment, etch stop layer 202 is a nitride layer (e.g., a silicon nitride layer) and insulating layer 203 is an oxide layer (e.g., a silicon oxide layer).

In one embodiment, metal layer 213 is deposited as a part of a back end of line (BEOL) process, after the substrate 201 with electronic devices (e.g., transistors, capacitors, resistors, memory array periphery devices, other electronic devices) is fabricated.

In one embodiment, insulating layer 203 is patterned and etched to form one or more dielectric features, e.g., trenches, openings, or both. The conductive features of the metal layer 213 are formed by depositing one or more conductive layers onto the one or more dielectric features in the insulating layer 203, as known to one of ordinary skill in the art of electronic device manufacturing.

Examples of the conductive materials that may be used for each of the conductive features include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, the insulating layer 203 is patterned and etched using one or more insulating layer patterning and etching techniques known to one of ordinary skill in the art of electronic device manufacturing. The one or more conductive layers are deposited onto the dielectric features in the insulating layer 203 using one or more conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

As shown in FIG. 2, memory cell 212 comprising a thin film transistor 238 coupled to a memory element 237 is on a portion of a metal layer 206 over metal layer 213. In one embodiment, memory cell 212 is a bitcell. In one embodiment, the thin film transistor 238 is a n-type transistor. In another embodiment, the thin film transistor 238 is a p-type transistor. In one embodiment, the memory element 237 is a thin film memory element.

As shown in FIG. 2, thin film transistor 238 comprises a thin film transistor layer 223 on a gate dielectric layer 222 on a gate electrode 221. A source region 228 and a drain region 229 are formed on thin film transistor layer 223. Gate electrode 221 is connected to metal interconnect 241 through a conductive via 219. As shown in FIG. 2, memory element 237 comprises a memory electrode 216 on a memory element layer 215. In one embodiment, each of the thin film transistor layer 223 and memory element layer 215 is an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof. In one embodiment, each of the memory element layer 215 and the thin film transistor layer 223 is an oxide film, e.g., a binary oxide (e.g., ruthenium oxide, titanium oxide, tantalum oxide), a ternary oxide (e.g., InZn-GaO). In one embodiment, the material of the memory element layer is the same as the material of the thin film transistor. In one embodiment, the memory layer and thin film transistor layer are of the same material deposited at the same time. In more specific embodiment, the material of each of the memory element layer and the thin film transistor layer, e.g., an oxide film is the same.

In one embodiment, the thickness of the thin film transistor layer 223 is less than about 100 nanometers (nm). In one embodiment, the thickness of the thin film transistor layer 223 is from about 2 nm to about 100 nm. In more specific embodiment, the thickness of the thin film transistor layer 223 is from about 10 nm to about 50 nm.

In one embodiment, the gate dielectric layer 222 is a high-k dielectric layer. In one embodiment, gate dielectric layer 222 is an oxide layer, e.g., a silicon oxide, a zirconium oxide ("ZrO2"), a hafnium oxide ("HFO2"), lanthanum oxide ("La2O4"), or other oxide layer known to one of ordinary skill in the art of electronic device manufacturing. In one embodiment, the thickness of the gate dielectric layer 222 is from about 2 nm to about 20 nm.

In one embodiment, gate electrode 221 is a metal gate electrode. In one embodiment, gate electrode 221 comprises one or more metals, e.g., tungsten, tantalum, titanium, hafnium, zirconium, aluminum, silver, tin, lead, copper, metal alloys, metal carbides, e.g., hafnium carbide, zirconium carbide, titanium carbide, tantalum carbide, aluminum carbide, other conductive materials, or any combination thereof.

As shown in FIG. 2, metal layer 206 comprises gate electrode 221, a conductive via 219, a metal interconnect 226, a metal interconnect 214 formed on an insulating layer 205 on an etch stop layer 204 on insulating layer 203. Insulating layer 205 can be any of the insulating layers described above. In one embodiment, insulating layer 205 is represented by insulating layer 203. Etch stop layer 204 can be any of the etch stop layers described above. In one embodiment, etch stop layer 204 is represented by etch stop layer 202.

In one embodiment, metal interconnect 226 is a ground line, or other conductive line, and metal interconnect 214 is a bitline, other conductive line, or other metal interconnect. In various embodiments, metal layer 206 comprises one or more conductive features, e.g., pads, conductive lines, trenches, interconnects, vias, other conductive elements, or any combination thereof formed on insulating layer 205. As shown in FIG. 2, thin film transistor 238 is on a portion 242 of the metal layer 206 and memory element 237 is on a portion 243 of the metal layer 206.

In one embodiment, insulating layer 205 is patterned and etched to form one or more dielectric features, e.g., trenches, openings, or both. One or more conductive layers are deposited onto the trenches to form metal interconnects 226 and 214, as known to as known to one of ordinary skill in the art of electronic device manufacturing. In one embodiment, a portion of the insulating layer 205 and a portion of the etch stop layer 204 are etched to form an opening down to metal interconnect 241. One or more conductive layers are deposited on the opening to form conductive via 219, as known to one of ordinary skill in the art of electronic device manufacturing.

Examples of the conductive materials that may be used for each of the conductive features of the metal layer 206 include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, the insulating layer 205 is patterned and etched using one or more insulating layer patterning and etching techniques known to one of ordinary skill in the art of electronic device manufacturing. One or more conductive layers are deposited onto the dielectric features in the insulating layer 205 using one or more conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

In one embodiment, the gate electrode 221 is deposited into a trench in the insulating layer 205 above the conductive via 219 using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

In one embodiment, gate dielectric layer 222 is deposited using one of the gate dielectric layer deposition techniques such as but not limited to a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

In one embodiment, thin film transistor layer 223 is deposited using one of the thin film deposition techniques such as but not limited to a sputtering, a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

Source region 228 and drain region 229 are formed using one of the thin film transistor source and drain region forming techniques, e.g., by depositing a metal using a sputtering technique to form a contact having a contact resistance which is lower that of the transistor's channel, or other deposition technique known to one of ordinary skill in the art of electronic device manufacturing.

In one embodiment, memory element layer 215 is a resistance switching layer that has a resistance that changes from one state (e.g., a conductive state, or a non-conductive state) to another state (a non-conductive, or a conductive state) when an electric field is applied. In another embodiment, memory element layer 215 is a phase changing memory layer that has a phase changing from one state (e.g., a crystalline state) to another state (e.g., an amorphous state) when a current is applied. In yet another embodiment, memory element layer 215 is a magnetic memory layer that has a magnetic state changing from one magnetic state to another magnetic state when an electric field is applied. A spacer 217 and a spacer 218 are formed on the opposing sidewalls of the memory element electrode 216 and memory element layer 215 to protect memory element 237. In one embodiment, each of the spacers 217 and 218 is a silicon nitride spacer.

In various embodiments, conductive materials used for memory electrode 216 include, but are not limited to, metals, e.g., copper, tungsten, tantalum, titanium, hafnium, zirconium, aluminum, silver, tin, lead, metal alloys, metal nitrides, e.g., titanium nitride, tantalum nitride, metal carbides, e.g., hafnium carbide, zirconium carbide, titanium carbide, tantalum carbide, aluminum carbide, other conductive materials, or any combination thereof. In one embodiment, the memory electrode 216 comprises a metal other than copper.

As shown in FIG. 2, an insulating layer 231 is formed on an etch stop layer 207 on metal layer 206. Insulating layer 231 can be any of the insulating layers described above. In one embodiment, insulating layer 231 is represented by insulating layer 203. Etch stop layer 207 can be any of the etch stop layers described above. In one embodiment, etch stop layer 207 is represented by etch stop layer 202. A conductive via 227, a conductive via 224, a conductive via 225 and memory element 237 are formed on insulating layer 231.

In one embodiment, forming conductive via 227 comprises patterning and etching a portion of insulating layer 231 and patterning and etching a portion of the etch stop layer 207 to form an opening to expose a portion of metal interconnect 226. One or more conductive layers are deposited through the opening on the exposed portion of the metal interconnect 226 to form conductive via 227. In one embodiment, forming conductive vias 224 and 225 comprises patterning and etching portions of insulating layer 231 to form openings down to source region 228 and drain region 229, and depositing one or more conductive layers into the openings and on the source region 228 and drain region 229.

In one embodiment, forming memory element 237 comprises patterning and etching a portion of insulating layer 231 and patterning and etching a portion of the etch stop layer 207 to form an opening to expose a portion of metal interconnect 214, depositing thin film memory element layer 215 through the opening on the exposed portion of the metal interconnect 214, depositing memory electrode 216 on the thin film memory element layer 215 and depositing spacers 217 and 218 on the opposing sidewalls of the thin film memory element layer 215 and on the opposing sidewalls of the memory electrode 216.

In one embodiment, thin film memory element layer 215 is deposited using one of the thin film deposition techniques such as but not limited to a sputtering, a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

In one embodiment, spacers 217 and 218 are deposited using one of the spacer deposition techniques such as but not limited to a sputtering, a chemical vapor deposition (CVD), e.g., a plasma enhanced chemical vapour deposition (PECVD), a physical vapour deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

In various embodiments, an insulating layer 231 is patterned and etched using one or more insulating layer patterning and etching techniques known to one of ordinary skill in the art of electronic device manufacturing to form one or more dielectric features, e.g., trenches, openings, or both. One or more conductive layers are deposited onto the dielectric features of the insulating layer 231 to form the conductive features. The one or more conductive layers are deposited onto the dielectric features of the insulating layer 231 using one or more conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

As shown in FIG. 2, an insulating layer 232 is formed on an etch stop layer 208 on insulating layer 231. Insulating layer 232 can be any of the insulating layers described above. In one embodiment, insulating layer 232 is represented by insulating layer 203. Etch stop layer 208 can be any of the etch stop layers described above. In one embodiment, etch stop layer 208 is represented by etch stop layer 202.

A metal layer 234 comprises a metal interconnect 235 and a metal interconnect 236 on portions of insulating layer 232 and etch stop layer 208. In one embodiment, each of the metal interconnects 235 and 236 is a conductive line. In various embodiments, metal layer 234 comprises one or more conductive features, e.g., pads, conductive lines, trenches, conductive vias, other conductive elements, or any combination thereof on portions of insulating layer 232 and etch stop layer 208. In at least some embodiments, the metal interconnects 235 and 236 include conductive barrier layers to prevent copper from the copper conductive lines to enter and diffuse into the insulating layers, e.g., oxide interlayer dielectics.

In one embodiment, forming metal interconnect 235 comprises patterning and etching a portion of insulating layer 232 to form a trench and patterning and etching a portion of etch stop layer 208 to form an opening underneath the trench to expose a portion of conductive via 227 and depositing one or more conductive layers into the trench and through the opening on the exposed portion of the conductive via 227.

In one embodiment, forming metal interconnect 236 comprises patterning and etching a portion of insulating layer 232 to form a trench and patterning and etching a portion of etch stop layer 208 to form an opening underneath the trench to expose a portion of memory electrode 216 and depositing one or more conductive layers into the trench and through the opening on the exposed portion of the memory electrode 216. In one embodiment, the insulating layer 232 is patterned and etched using one or more insulating layer patterning and etching techniques known to one of ordinary skill in the art of electronic device manufacturing. The one or more conductive layers are deposited onto the patterned and etched portions of the insulating layer 232 and etch stop layer 208 using one or more conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

Source region 228 is connected to metal interconnect 226 by conductive via 224, metal interconnect 235 and conductive via 227. Drain region 229 is connected to memory element 237 by conductive via 225 and metal interconnect 236, as shown in FIG. 2.

Examples of the conductive materials that may be used for each of the metal layers include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

As shown in FIG. 2, an etch stop layer 209 is deposited on metal layer 234 on insulating layer 232. Etch stop layer 209 can be any of the etch stop layers described above. In one embodiment, etch stop layer 209 is represented by etch stop layer 202. An insulating layer 211 is deposited on etch stop layer 209.

In various embodiments, each of the etch stop layers 202, 204, 207, 208 and 209 comprises one or more insulating layers. In various embodiments, each of the etch stop layers 202, 204, 207, 208 and 209 is a nitride layer, e.g., a silicon nitride, a silicon oxide nitride, an oxide layer, e.g., a silicon oxide layer, an aluminum oxide, a carbon doped silicon oxide, other etch stop layer, or any combination thereof. In various embodiments, the thickness of each of the etch stop layers 202, 204, 207, 208 and 209 is from about 5 nm to about 20 nm.

In various embodiments, each of the etch stop layers 202, 204, 207, 208 and 209 is deposited using one or more deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In various embodiments, each of the insulating layers 203, 205, 231, 232 and 211 comprises one or more insulating layers. In various embodiments, each of the insulating layers 203, 205, 231, 232 and 211 is an interlayer dielectric (ILD) layer. In various embodiments, each of the insulating layers 203, 205, 231, 232 and 211 is an oxide layer, e.g., a silicon oxide layer, an aluminum oxide, a carbon doped silicon oxide, or other electrically insulating layer. In alternate embodiments, each of the insulating layers 203, 205, 231, 232 and 211 comprises organic materials, inorganic materials, or both. In various embodiments, the thickness of each of the insulating layers 203, 205, 231, 232 and 211 is determined by design. In one embodiment, each of the insulating layers 203, 205, 231, 232 and 211 is deposited to the thickness from about 50 nanometers (nm) to about 200.

In various embodiments, each of the insulating layers 203, 205, 231, 232 and 211 is deposited using one or more deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 3:
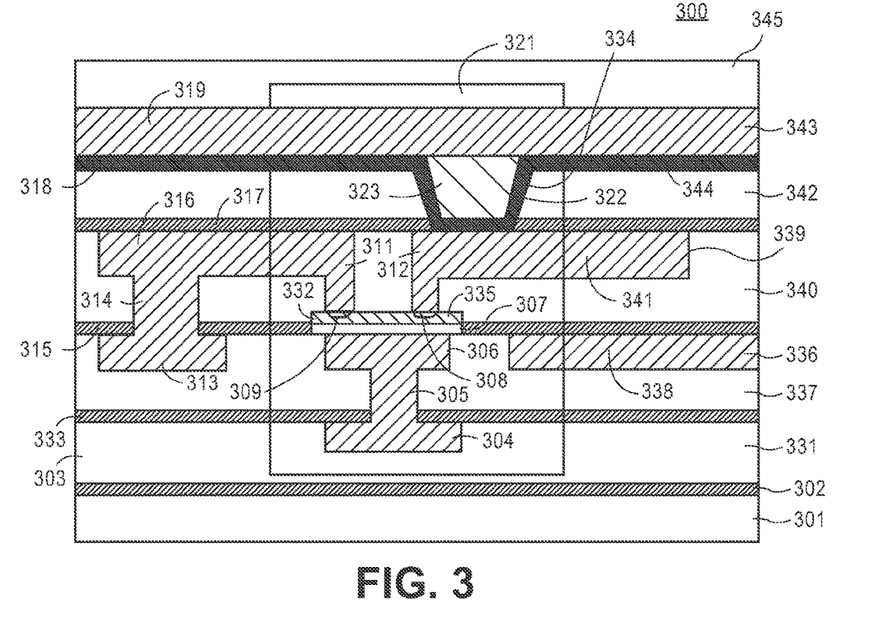
FIG. 3 shows a side view of a stackable memory cell according to another embodiment.

FIG. 3 shows a side view 300 of a stackable memory cell according to another embodiment. As shown in FIG. 3, a metal layer 331 comprises a metal interconnect 304 formed on an insulating layer 303 on an etch stop layer 302 on a substrate 301. In one embodiment, metal interconnect 304 represents metal interconnect 241. In one embodiment, metal layer 331 represents metal layer 213. Substrate 301 represents substrate 201. Etch stop layer 302 represents etch stop layer 202. Insulating layer 303 represents insulating layer 203. As shown in FIG. 3, memory cell 321 comprises a memory element 334 between metal layers stacked above a thin film transistor 332. In one embodiment, memory cell 321 is a bitcell. Having the transistor and memory element between different metal layers reduces the size of the memory cell. In at least some embodiments, the area of the memory cell 321 is comparable to a static random access memory (SRAM) bitcell area. In one embodiment, the thin film transistor 332 is a n-type transistor. In another embodiment, the thin film transistor 332 is a p-type transistor. In one embodiment, the memory element 334 is a thin film memory element.

As shown in FIG. 3, thin film transistor 332 comprises a thin film transistor layer 335 on a gate dielectric layer 307 on a gate electrode 306. A source region 309 and a drain region 308 are formed on thin film transistor layer 335. Gate electrode 306 is connected to metal interconnect 304 through a conductive via 219. As shown in FIG. 3, memory element 334 comprises a memory electrode 323 on a memory element layer 322. In one embodiment, the thin film transistor layer 335 is represented by thin film transistor layer 223. In one embodiment, the memory element layer 322 is represented by memory element layer 215. In one embodiment, memory element layer 322 comprises a material similar to the material of the memory element layer 215. In one embodiment, memory element layer 322 comprises a plurality of layers, e.g., a tantalum layer (e.g., tantalum nitride, tantalum), a titanium layer (e.g., titanium nitride, titanium), an oxide layer, or any combination thereof). In one embodiment, memory electrode 323 is represented by memory electrode 216. In one embodiment, gate dielectric layer 307 is represented by gate dielectric layer 222. In one embodiment, gate electrode 306 is represented by gate electrode 221.

As shown in FIG. 3, a metal layer 336 comprises gate electrode 306, a conductive via 305, a metal interconnect 313 and a metal interconnect 338 formed on an insulating layer 337 on an etch stop layer 303 on insulating layer 303. Insulating layer 337 can be any of the insulating layers described above. In one embodiment, insulating layer 337 is represented by insulating layer 203. Etch stop layer 303 can be any of the etch stop layers described above. In one embodiment, etch stop layer 303 is represented by etch stop layer 202. In one embodiment, metal interconnect 313 is a ground line, other conductive line, or other metal interconnect. In one embodiment, metal interconnect 338 is a conductive line, or other metal interconnect. In various embodiments, metal layer 336 comprises one or more conductive features, e.g., pads, conductive lines, trenches, interconnects, vias, other conductive elements, or any combination thereof formed on insulating layer 331.

As shown in FIG. 3, thin film transistor 332 is on a portion of the metal layer 336, and memory element 334 is on a metal layer 339 above the thin film transistor. An insulating layer 340 is formed on an etch stop layer 315 on metal layer 336. Insulating layer 340 can be any of the insulating layers described above. In one embodiment, insulating layer 340 is represented by insulating layer 203. Etch stop layer 315 can be any of the etch stop layers described above. In one embodiment, etch stop layer 315 is represented by etch stop layer 202. Metal layer 339 comprises a conductive via 314 coupled to a conductive line 316 coupled to a conductive via 311, and a conductive via 312 coupled to a conductive line 341 formed on insulating layer 340. In various embodiments, metal layer 339 comprises one or more conductive features, e.g., pads, conductive lines, trenches, interconnects, vias, other conductive elements, or any combination thereof on portions of insulating layer 340. Source region 309 is connected to metal interconnect 313 by conductive via 314, conductive line 316 and conductive via 311. Drain region 308 is connected to memory element 334 by conductive via 312 and conductive line 341, as shown in FIG. 3.

An insulating layer 342 is deposited on an etch stop layer 317 on metal layer 339.

Insulating layer 342 can be any of the insulating layers described above. In one embodiment, insulating layer 342 is represented by insulating layer 203. Etch stop layer 317 can be any of the etch stop layers described above. In one embodiment, etch stop layer 317 is represented by etch stop layer 202. Memory element 334 is formed on insulating layer 342.

In one embodiment, forming memory element 334 comprises patterning and etching a portion of insulating layer 342 and patterning and etching a portion of the etch stop layer 317 to form an opening to expose a portion of metal interconnect 341, depositing thin film memory element layer 322 through the opening on the exposed portion of the metal interconnect 341 and depositing memory electrode 323 on the thin film memory element layer 322, as described above. In one embodiment, spacers (not shown) are deposited on the opposing sidewalls of the thin film memory element layer 322 and on the opposing sidewalls of the memory electrode 323 to protect the memory element, as described above.

A metal layer 343 comprising a metal interconnect 319 is formed on thin film memory element layer 322 and memory electrode 323. In one embodiment, portions of the memory element layer 322 between insulating layer 342 and metal interconnect 319, such as a portion 318 and a portion 344 act as an etch stop layer. In one embodiment, metal interconnect 319 is a bitline, other conductive line, or other metal interconnect. An insulating layer 345 is deposited on metal interconnect 319, as shown in FIG. 3. Insulating layer 345 can be any of the insulating layers as described above.

Figure 4:
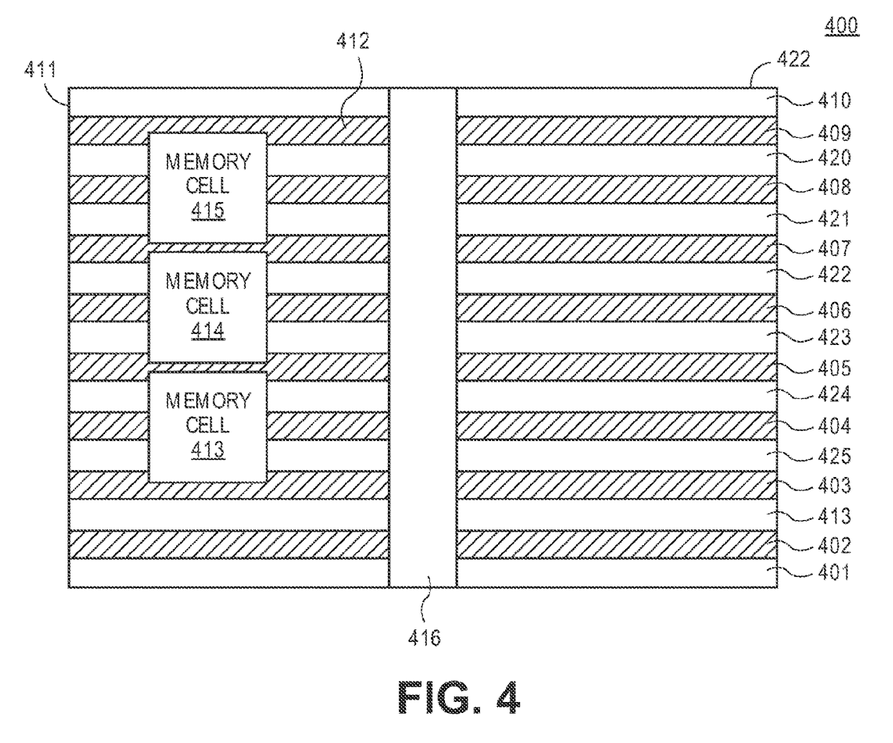
FIG. 4 is a side view of a system on chip (SoC) according to one embodiment.

FIG. 4 is a side view 400 of a system on chip (SoC) 411 according to one embodiment. The SOC comprises a memory block 412 and a logic block 422 formed on a substrate 401. An insulating trench 416 is foliated between memory block 412 and logic block 422, as shown in FIG. 4. Substrate 401 can be any of the substrates described above. In one embodiment, substrate 401 represents substrate 201. The memory block 412 comprises a stack of memory cells, such as a memory cell 415 over a memory cell 414 over a memory cell 413 over substrate 401. In one embodiment, the memory block 412 is a part of the 3D non-volatile memory (NVM). In one embodiment, logic block 412 comprises a logic element, a processor, or any other integrated circuit comprising one or more n-type and p-type transistors formed on substrate 401.

A plurality of metal layers and insulating layers are formed on substrate 401, as shown in FIG. 4. Each of the metal layers is positioned between corresponding insulating layers, such that a stack comprises an insulating layer 410 on a metal layer 409 on an insulating layer 420 on a metal layer 408 on an insulating layer 421 on a metal layer 407 on an insulating layer 422 on a metal layer 406 on an insulating layer 423 on a metal layer 405 on an insulating layer 424 on a metal layer 404 on an insulating layer 425 on a metal layer 403 on insulating layer 413 on metal layer 402 on substrate 401. In one embodiment, each of the metal layers 402, 403, 404, 405, 406, 407, 408 and 409 represents one of the metal layers described above. In one embodiment, each of the insulating layers 410, 420, 421, 422, 423, 424 and 425 represents one of the insulating layers described above. In one embodiment, each of the insulating layers 410, 420, 421, 422, 423, 424 and 425 comprises an etch stop layer, such as one of the etch stop layers described above.

As shown in FIG. 4, a memory cell 415 is deposited between metal layers 409 and 407 over a memory cell 414. Memory cell 414 is deposited between metal layers 407 and 405 over a memory cell 413. Memory cell 413 is deposited between metal layers 405 and 403 over a metal layer 402 on substrate 401. Each of the memory cells 415, 414 and 413 comprises a thin film transistor formed over a metal layer over a substrate and a thin film memory element coupled to the thin film transistor, as described above. Stacking memory cells over each other advantageously reduces the size of the memory area on the substrate. In one embodiment, the stacked memory block 412 is a part of the In one embodiment, all thin film transistors of the memory cells of the memory array block are n-type transistors. In more specific embodiment, all thin film transistors of the memory cells of the memory array block are n-type metaloxidesemiconductor (NMOS) transistors.

Figure 5:
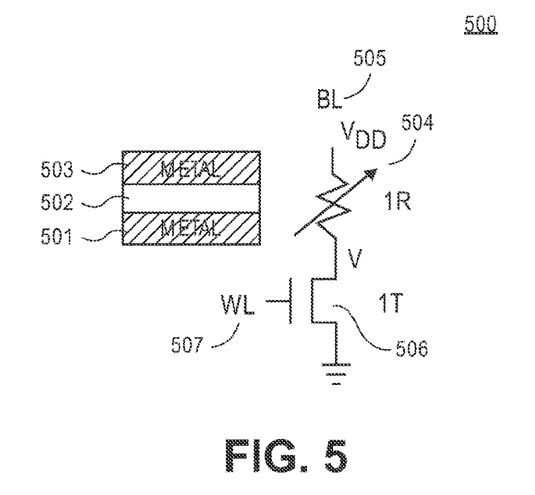
FIG. 5 is a diagram of an equivalent circuit of the memory cell according to one embodiment.

FIG. 5 is a diagram 500 of an equivalent circuit of the memory cell according to one embodiment. The equivalent circuit comprises a transistor 506 having a gate electrode connected to a word line (WL) 507, a source connected to a ground and a drain connected to a resistor element 504. Other end of the resistor element is connected to a bit line (BL) 505. The resistance of the resistor element 504 changes from a conductive state to a non-conductive state depending on an input (e.g., drain current, voltage) from transistor 506, as described above. As shown in FIG. 5, the resistor element comprises a resistor layer 502 between electrodes 503 and 501.

Figure 6:
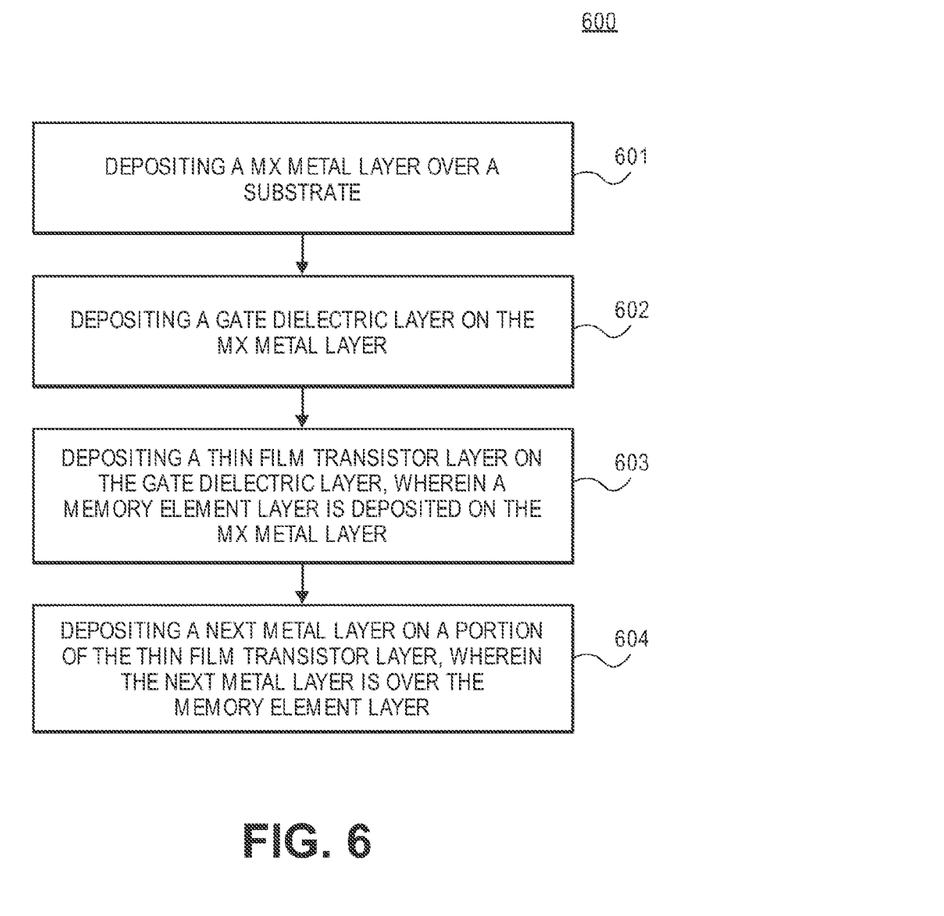
FIG. 6 is a flowchart of a method to manufacture a memory cell according to one embodiment.

FIG. 6 is a flowchart of a method 600 to manufacture a memory cell according to one embodiment. At operation 601 a metal layer is deposited over a substrate, as described above. In one embodiment, the metal layer is a Mx metal layer, where x is any integer number except zero. At operation 602 a gate dielectric layer is deposited on a portion of the metal layer, as described above. At operation 603 a thin film transistor layer is deposited on the gate dielectric layer, as described above. In one embodiment, a memory element layer is deposited on a portion of the first metal layer, as described above. At operation 604 a next metal layer is deposited on a portion of the thin film transistor layer. In one embodiment, the next metal layer is a Mx+1 metal layer, where x is any integer number except zero. In one embodiment, the next metal layer is over the memory element layer, so that the thin film transistor and memory element are between Mx and Mx+1 metal layers, as described above with respect to FIG. 2.

Figure 7:
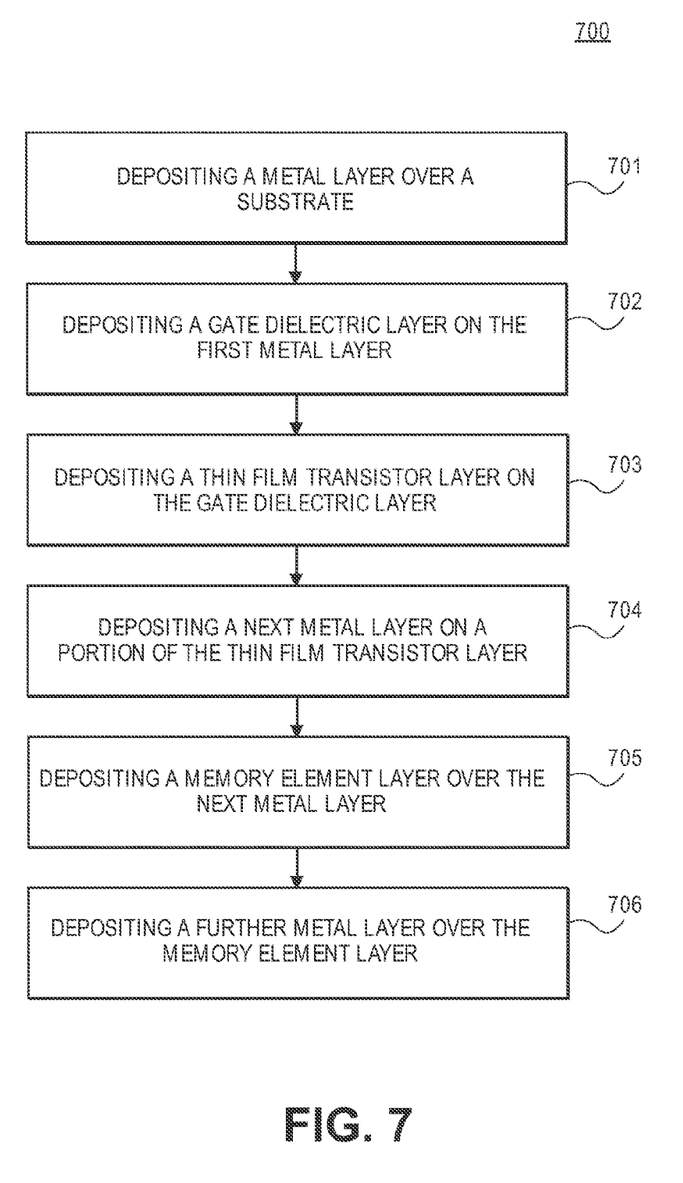
FIG. 7 is a flowchart of a method to manufacture a memory cell according to another embodiment.

FIG. 7 is a flowchart of a method 700 to manufacture a memory cell according to another embodiment. At operation 701 a metal layer is deposited over a substrate, as described above. In one embodiment, the metal layer is a Mx metal layer, where x is any integer number except zero. At operation 702 a gate dielectric layer is deposited on the metal layer, as described above. At operation 703 a thin film transistor layer is deposited on the gate dielectric layer, as described above. At operation 704 a next metal layer is deposited on a portion of the thin film transistor layer, as described above. In one embodiment, the next metal layer is a Mx+1 metal layer, where x is any integer number except zero. At operation 705 a memory element layer is deposited over the next metal layer. In one embodiment, the memory element layer is deposited on the Mx+1 metal layer. In another embodiment, the memory element layer is deposited on a $M_y$ metal layer above the next memory layer, where y is any integer other than x and zero. At operation 706 a further $M_{y+1}$ metal layer is deposited over the memory element layer. In one embodiment, the thin film transistor is between Mx and Mx+1 metal layers, and memory element is between $M_y$ and $M_{y+1}$ metal layers, as described above with respect to FIG. 3.

Figure 8:
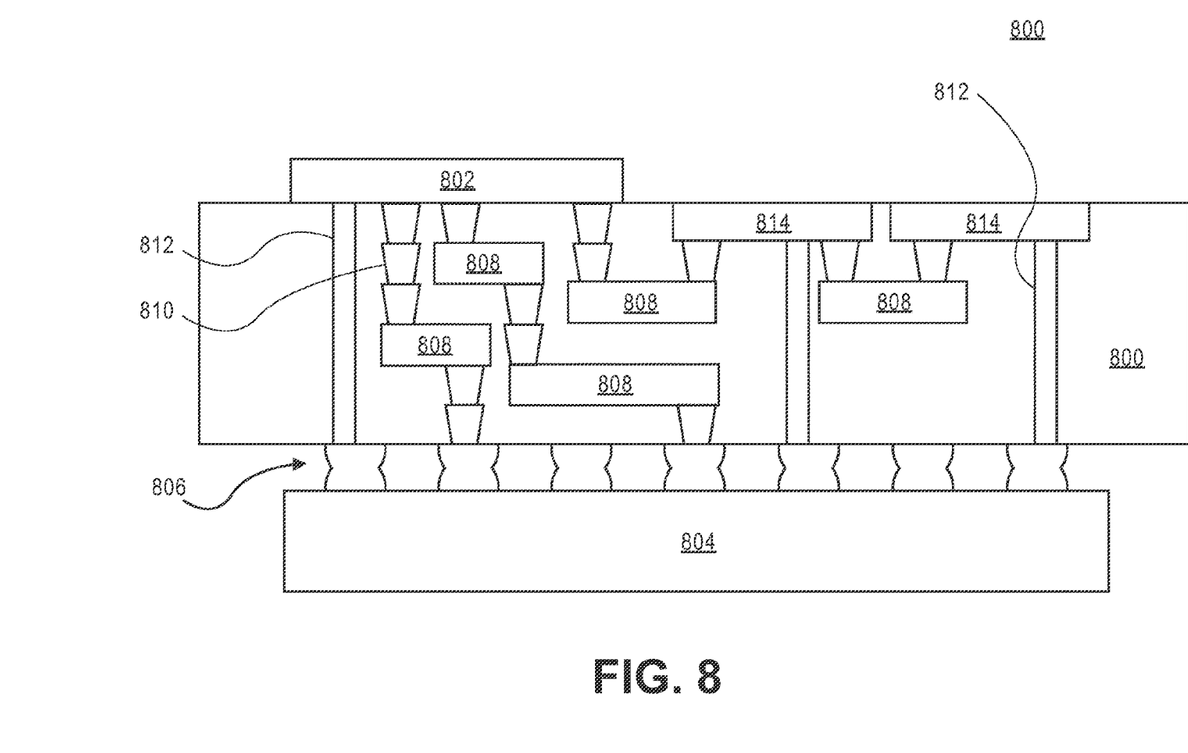
FIG. 8 illustrates an interposer that includes one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module that includes one or more embodiments described herein, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including passive and active devices. Such devices include, but are not limited to, stackable thin film based memory devices as described herein, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and stackable thin film memory devices may also be formed on the interposer 800. In accordance with embodiments of the invention, apparatuses or processes disclosed herein may be used in the fabrication of interposer 800.

Figure 9:
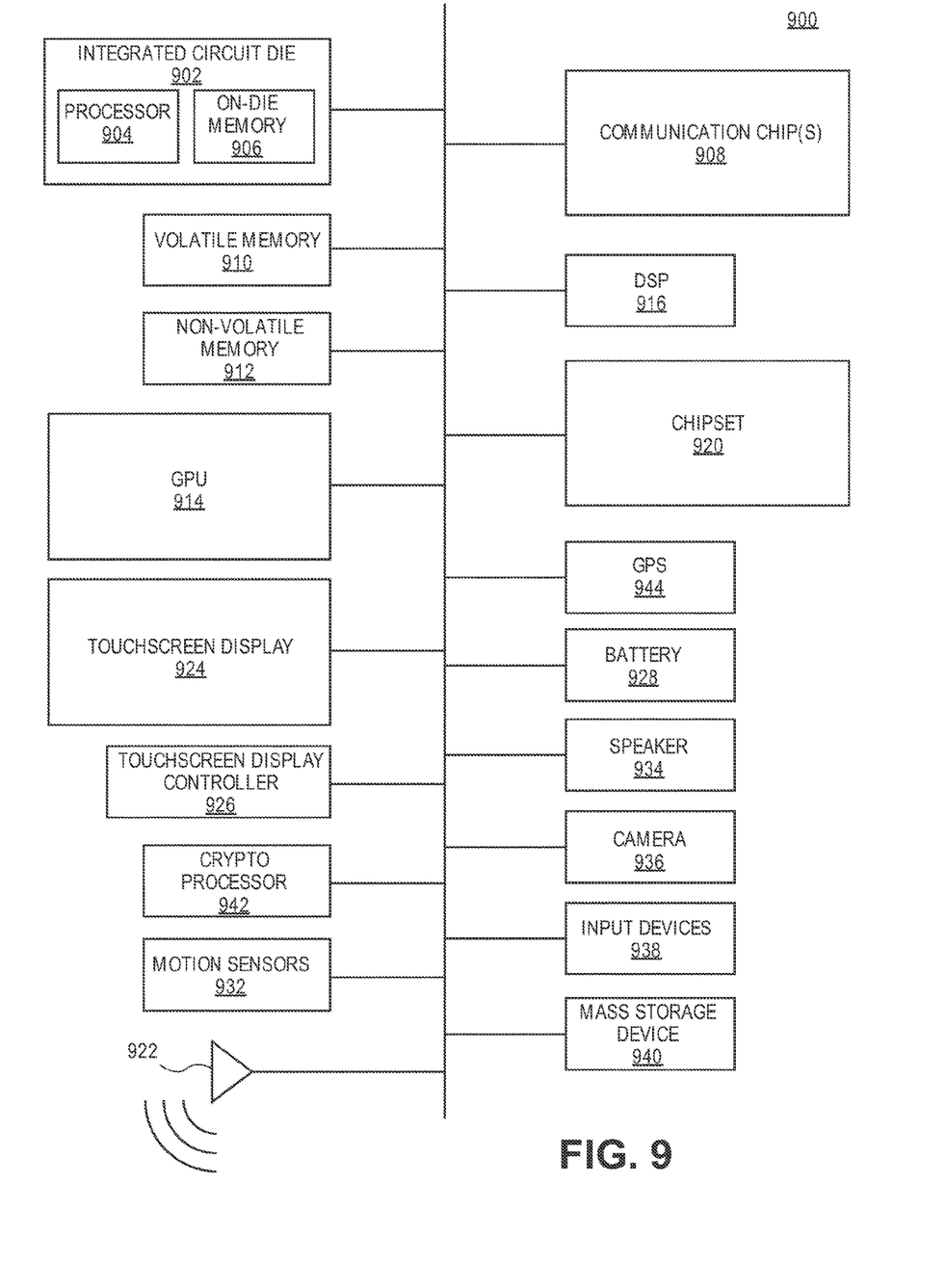
FIG. 9 illustrates a computing device in accordance with one embodiment of the invention.

FIG. 9 illustrates a computing device 900 in accordance with one embodiment of the invention. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a processor 904 such as a central processing unit (CPU), an on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, a volatile memory 910 (e.g., DRAM), a non-volatile memory 912 (e.g., ROM or flash memory), a graphics processing unit 914 (GPU), a digital signal processor 916 (DSP), a crypto processor 942 (a specialized processor that executes cryptographic algorithms within hardware), a chipset 920, an antenna 922, a display or a touchscreen display 924, a touchscreen display controller 926, a battery 928 or other power source, a global positioning system (GPS) device 944, a power amplifier (PA), a compass, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communication chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 902, on-die memory 906, volatile memory 910, non-volatile memory 912, communication chip 908, GPU 914, crypto processor 942, DSP 916, chipset 920, and other components may include one or more stackable thin film memory devices formed in accordance with embodiments of the invention. In further embodiments, another component housed within the computing device 1400 may contain one or more stackable thin film memory devices formed in accordance with embodiments of the invention.

In various embodiments, the computing device 1400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a memory comprises a thin film transistor over a first metal layer over a substrate; and a memory element coupled to the thin film transistor.

In one embodiment, a memory comprises a thin film transistor over a first metal layer over a substrate; and a memory element coupled to the thin film transistor, wherein the memory element is a thin film memory element.

In one embodiment, a memory comprises a thin film transistor over a first metal layer over a substrate; and a memory element coupled to the thin film transistor, wherein the thin film transistor comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

In one embodiment, a memory comprises a thin film transistor over a first metal layer over a substrate; and a memory element coupled to the thin film transistor, wherein the memory element is on a portion of the first metal layer.

In one embodiment, a memory comprises a thin film transistor over a first metal layer over a substrate; and a memory element coupled to the thin film transistor, wherein the memory element is on a second metal layer over the thin film transistor.

In one embodiment, a memory comprises a thin film transistor over a first metal layer over a substrate; and a memory element coupled to the thin film transistor, wherein each of the memory element and the thin film transistor comprises an oxide film.

In one embodiment, a memory comprises a thin film transistor over a first metal layer over a substrate; and a memory element coupled to the thin film transistor, wherein the substrate is a flexible substrate.

In one embodiment, a memory block comprises a first memory cell comprising a first thin film transistor over a first metal layer over a substrate; and a second memory cell over the first memory cell.

In one embodiment, a memory block comprises a first memory cell comprising a first thin film transistor over a first metal layer over a substrate; and a second memory cell over the first memory cell, wherein the first memory cell comprises a first thin film memory element coupled to the first thin film transistor.

In one embodiment, a memory block comprises a first memory cell comprising a first thin film transistor over a first metal layer over a substrate; and a second memory cell over the first memory cell, wherein the second memory cell comprises a second thin film transistor over a second metal layer.

In one embodiment, a memory block comprises a first memory cell comprising a first thin film transistor over a first metal layer over a substrate; and a second memory cell over the first memory cell, wherein the first thin film transistor comprises an oxide film.

In one embodiment, a memory block comprises a first memory cell comprising a first thin film transistor over a first metal layer over a substrate; and a second memory cell over the first memory cell, wherein the first thin film transistor comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

In one embodiment, a memory block comprises a first memory cell comprising a first thin film transistor over a first metal layer over a substrate; and a second memory cell over the first memory cell, wherein the substrate is a flexible substrate.

In one embodiment, a system comprises a memory block comprising a first thin film transistor over a first metal layer over a substrate; and a logic block coupled to the memory block.

In one embodiment, a system comprises a memory block comprising a first thin film transistor over a first metal layer over a substrate; and a logic block coupled to the memory block, wherein the memory block comprises a first thin film memory element coupled to the first thin film transistor.

In one embodiment, a system comprises a memory block comprising a first thin film transistor over a first metal layer over a substrate; and a logic block coupled to the memory block, wherein the memory block comprises a second thin film transistor over a second metal line.

In one embodiment, a system comprises a memory block comprising a first thin film transistor over a first metal layer over a substrate; and a logic block coupled to the memory block, wherein the first thin film transistor comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

In one embodiment, a system comprises a memory block comprising a first thin film transistor over a first metal layer over a substrate; and a logic block coupled to the memory block, wherein the first thin film transistor comprises an oxide film.

In one embodiment, a system comprises a memory block comprising a first thin film transistor over a first metal layer over a substrate; and a logic block coupled to the memory block, wherein the substrate is a flexible substrate.

In one embodiment, a system comprises a memory block comprising a first thin film transistor over a first metal layer over a substrate; and a logic block coupled to the memory block, wherein the logic block comprises one or more transistors on the substrate.

In one embodiment, a method to manufacture a memory comprises depositing a thin film transistor layer over a first portion of a first metal layer over a substrate; and depositing a memory element layer coupled to the thin film transistor layer.

In one embodiment, a method to manufacture a memory comprises depositing a thin film transistor layer over a first portion of a first metal layer over a substrate; and depositing a memory element layer coupled to the thin film transistor layer, wherein the thin film transistor layer comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

In one embodiment, a method to manufacture a memory comprises depositing a thin film transistor layer over a first portion of a first metal layer over a substrate; and depositing a memory element layer coupled to the thin film transistor layer, wherein the memory element layer is on a second portion of the first metal layer.

In one embodiment, a method to manufacture a memory comprises depositing a thin film transistor layer over a first portion of a first metal layer over a substrate; and depositing a memory element layer coupled to the thin film transistor layer, wherein each of the memory element layer and the thin film transistor layer comprises an oxide film.

In one embodiment, a method to manufacture a memory comprises depositing a thin film transistor layer over a first portion of a first metal layer over a substrate; and depositing a memory element layer coupled to the thin film transistor layer, wherein the substrate is a flexible substrate.

In one embodiment, a method to manufacture a memory comprises depositing a gate dielectric layer on a first portion of a first metal layer over a substrate; depositing a thin film transistor layer on the gate dielectric layer; depositing a memory element layer coupled to the thin film transistor layer; and depositing a second metal layer on a portion of the thin film transistor layer.

In one embodiment, a method to manufacture a memory comprises depositing a thin film transistor layer over a first portion of a first metal layer over a substrate; depositing a memory element layer coupled to the thin film transistor layer; and depositing a third metal layer over the memory element layer.

In one embodiment, a method to manufacture a memory comprises depositing a thin film transistor layer over a first portion of a first metal layer over a substrate; depositing a memory element layer coupled to the thin film transistor layer, wherein the memory element layer is on a second metal layer over the first metal layer.

In one embodiment, a method to manufacture a memory comprises depositing a thin film transistor layer over a first portion of a first metal layer over a substrate; depositing a memory element layer coupled to the thin film transistor layer, wherein the memory element layer and the thin film transistor layer are deposited at the same time.

In one embodiment, a method to manufacture a memory comprises depositing a thin film transistor layer over a first portion of a first metal layer over a substrate; depositing a memory element layer coupled to the thin film transistor layer, wherein a material of the memory element layer and the material of the thin film transistor layer is the same.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A memory, comprising:
 a thin film transistor over a first metal layer over a substrate, the thin film transistor comprising:
  a thin film transistor layer having an upper surface and a lower surface;
  a gate dielectric layer on the lower surface of the thin film transistor layer;
  a gate electrode on the gate dielectric layer;
  a source region on the upper surface of the thin film transistor layer; and
  a drain region on the upper surface of the transistor layer; and
 a memory element coupled to the thin film transistor.

2. The memory of claim 1, wherein the thin film transistor layer comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

3. The memory of claim 1, wherein the memory element is on a portion of the first metal layer.

4. The memory of claim 1, wherein the memory element is on a second metal layer over the thin film transistor.

5. The memory of claim 1, wherein each of the memory element and the thin film transistor comprises an oxide film.

6. The memory of claim 1, wherein the substrate is a flexible substrate.

7. The memory of claim 1, wherein the memory element is a thin film memory element.

8. A system comprising:
 a first memory cell comprising a first thin film transistor over a first metal layer over a substrate, the first thin film transistor comprising:
  a thin film transistor layer having an upper surface and a lower surface;
  a gate dielectric layer on the lower surface of the thin film transistor layer;
  a gate electrode on the gate dielectric layer;
  a source region on the upper surface of the thin film transistor layer; and
  a drain region on the upper surface of the transistor layer; and
 a second memory cell over the first memory cell.

9. The system of claim 8, wherein the first memory cell comprises a first thin film memory element coupled to the first thin film transistor.

10. The system of claim 8, wherein the second memory cell comprises a second thin film transistor over a second metal layer.

11. The system of claim 8, wherein the first thin film transistor comprises an oxide film.

12. The system of claim 8, wherein the first thin film transistor layer comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

13. The system of claim 8, wherein the substrate is a flexible substrate.

14. A method to manufacture a system comprising:
 depositing a gate dielectric layer on a gate electrode layer over a first portion of a first metal layer over a substrate;
 depositing a thin film transistor layer over the gate dielectric layer;
 forming a source region and a drain region over the thin film transistor layer; and
 depositing a memory element layer coupled to the thin film transistor layer.

15. The method of claim 14, wherein the thin film transistor layer comprises an amorphous oxide semiconductor (AOS) film, a polycrystalline silicon film, an amorphous silicon film, a polycrystalline III-V semiconductor film, a polycrystalline germanium, an amorphous germanium, an organic film, a transition metal dichalcogenide (TMD) film, or any combination thereof.

16. The method of claim 14, wherein the memory element layer is on a second portion of the first metal layer.

17. The method of claim 14, wherein each of the memory element layer and the thin film transistor layer comprises an oxide film.

18. The method of claim 14, wherein the substrate is a flexible substrate.

19. The method of claim 14, further comprising depositing a second metal layer on a portion of the thin film transistor layer, wherein the second metal layer is over the memory element layer.

20. The method of claim 19 further comprising depositing a third metal layer over the memory element layer.

* * * * *